US011709517B2

(12) United States Patent
Fu et al.

(10) Patent No.: US 11,709,517 B2
(45) Date of Patent: Jul. 25, 2023

(54) BIAS CURRENT GENERATOR CIRCUIT

(71) Applicant: NXP USA, Inc., Austin, TX (US)

(72) Inventors: Jiawei Fu, Suzhou (CN); Jianzhou Wu, Suzhou (CN); Jie Jin, Suzhou (CN); Yikun Mo, Suzhou (CN); Stefano Pietri, Austin, TX (US)

(73) Assignee: NXP USA, Inc., Austin, TX (US)

( * ) Notice: Subject to any disclaimer, the term of this patent is extended or adjusted under 35 U.S.C. 154(b) by 210 days.

(21) Appl. No.: 17/249,717

(22) Filed: Mar. 10, 2021

(65) Prior Publication Data

US 2021/0286389 A1    Sep. 16, 2021

(30) Foreign Application Priority Data

Mar. 12, 2020    (CN) .......................... 202010173143.8

(51) Int. Cl.
*G05F 3/20* (2006.01)
*G05F 3/26* (2006.01)
*H01L 29/8605* (2006.01)
*H01L 27/08* (2006.01)
*H01L 27/06* (2006.01)
*H01L 49/02* (2006.01)

(52) U.S. Cl.
CPC .............. *G05F 3/205* (2013.01); *G05F 3/262* (2013.01); *H01L 27/0629* (2013.01); *H01L 27/0802* (2013.01); *H01L 28/20* (2013.01); *H01L 29/8605* (2013.01)

(58) Field of Classification Search
None
See application file for complete search history.

(56) References Cited

U.S. PATENT DOCUMENTS

| 5,315,149 | A | 5/1994 | Compagne |
|---|---|---|---|
| 5,600,276 | A * | 2/1997 | Imamura ................... G06G 7/62 |
| | | | 327/362 |
| 5,661,332 | A | 8/1997 | Nakamura et al. |
| 6,018,272 | A | 1/2000 | Marsh et al. |
| 6,441,460 | B1 | 8/2002 | Viebach |
| 6,650,176 | B1 | 11/2003 | Lorenz |
| 7,098,720 | B1 * | 8/2006 | Dow ........................ G06F 1/206 |
| | | | 361/103 |
| 7,902,907 | B2 | 5/2011 | Tanzawa |

(Continued)

FOREIGN PATENT DOCUMENTS

| CN | 107276575 A | 10/2017 |
|---|---|---|
| CN | 107300943 A | 10/2017 |

(Continued)

*Primary Examiner* — Thomas J. Hiltunen

(57) ABSTRACT

A bias current generator circuit includes a current path and a leakage control circuit. The current path is connected between a supply voltage and a ground level. The current path includes a transistor and a resistor. The transistor has a current channel connected in the current path. The resistor has an upper terminal and a lower terminal connected in the current path, and a well contact to allow a reverse leakage current of the resistor to flow through. The leakage control circuit is connected to the supply voltage. The leakage control circuit includes a driving transistor to provide a driving voltage to the well contact of the resistor, and to allow the reverse leakage current of the resistor to flow into the leakage control circuit.

19 Claims, 7 Drawing Sheets

(56) References Cited

U.S. PATENT DOCUMENTS

| | | | |
|---|---|---|---|
| 7,965,128 B2 * | 6/2011 | Yamamoto | H01L 27/0647 |
| | | | 327/512 |
| 10,249,769 B1 | 4/2019 | Daley | |
| 2003/0062593 A1 | 4/2003 | Lakshmikumar | |
| 2008/0278213 A1 | 11/2008 | Morini | |
| 2017/0154949 A1 | 6/2017 | Van Veldhoven et al. | |

FOREIGN PATENT DOCUMENTS

| | | |
|---|---|---|
| CN | 108536208 A | 9/2018 |
| CN | 108664065 A | 10/2018 |
| CN | 109009156 A | 12/2018 |
| JP | 8023072 A | 1/1996 |
| JP | 09213883 A | 8/1997 |
| JP | 2007074022 A | 3/2007 |
| WO | 96/25793 A1 | 8/1996 |

* cited by examiner

BIAS CURRENT GENERATOR CIRCUIT

CROSS-REFERENCE TO RELATED APPLICATIONS

This application claims the priority under 35 U.S.C. § 119 of China application no. 202010173143.8, filed on 12 Mar. 2020, the contents of which are incorporated by reference herein.

BACKGROUND

The present disclosure generally relates to a circuit for generating bias current. More particularly, the present disclosure relates to a bias current generator circuit with reduced leakage.

Various circuits employ a bias current generator circuit to receive a bias current therefrom, for adjusting parameters of their provided signals. For example, a current controlled oscillator (CCO) which generates a clock signal adjusts a frequency of the clock signal based on a bias current provided by the bias current generator circuit.

FIG. 1 is a circuit diagram of a bias current generator circuit. The bias current generator circuit 100 includes a first current path 102 and a second current path 104. The first current path 102 and the second current path 104 are connected in parallel between a supply voltage $V_{DD}$ and a ground level. The first current path 102 includes a first transistor 106, a second transistor 108, and a third transistor 110 that are series connected. The second current path 104 includes a fourth transistor 112, a fifth transistor 114, a diffusion resistor 116, and a poly resistor 118 that are series connected. In the context of the present disclosure, a poly resistor is an integrated passive device, which is formed as part of an integrated circuit and generally comprises a film or strip of poly silicon material having a well-defined resistance between two terminals of contact points. Similarly, in the context of the present disclosure a diffusion resistor is an integrated passive device which is formed as part of an integrated circuit, and generally comprises a film or strip of the material, having a defined resistance between two terminals of contact points, as will be discussed in more detail with respect to FIG. 2. Such integrated passive devices differ from conventional discrete resistors, in that they can have a so-called 'well contact'. Unlike conventional discrete resistors, the integrated resistors can be tied, at either one of the two terminals, or at some point—or even a distributed area—to a voltage level existing in the integrated circuit. In detail, the first to third transistors 106, 108, 110 each has a current channel between two main terminals, and a control terminal. The current channels of the first to third transistors 106, 108, 110 are series connected in the first current path 102. Similarly, the fourth and fifth transistors 112, 114 each has a current channel between two main terminals, and a control terminal. The current channels of the fourth and fifth transistors 112, 114, and the diffusion resistor 116, the poly resistor 118 are series connected in the second current path 104. Control terminals of the first transistor 106 and the fourth transistor 112 are connected together, and control terminals of the second transistor 108 and the fifth transistor 114 are connected together. A mirror transistor 120 is connected as a mirror to the fourth transistor 112, to provide a mirror current to the current flowing through the current channel of the fourth transistor 112, as a bias current of the bias current generator circuit 100.

The diffusion resistor 116 has two current terminals that are connected into the second current path 104, and a well contact connected to the supply voltage $V_{DD}$. Similarly, the poly resistor 118 has two current terminals that are connected into the second current path 104, and a well contact connected to the supply voltage $V_{DD}$. FIG. 2 shows, in details, schematic structure diagrams of the diffusion resistor 116 and the poly resistor 118 according to a fabrication process. Both the diffusion resistor 116 and the poly resistor 118 are fabricated on a substrate 202 which is, according to the present example, a P-type doped substrate. The diffusion resistor 116 is arranged in a first N-well 204 on the substrate 202, and the poly resistor 118 is arranged over the second N-well 206 on the substrate 202.

In the first N-well 204, a diffusion area 208 is formed to provide the diffusion resistor 116. The diffusion area 208 has a higher doping concentration than that of the P-type substrate 202, and accordingly can be referred to as a P+ type diffusion area 208. The diffusion area 208 provides the current terminals of the diffusion resistor 116 at its lateral ends. An N-type doped area 210 having a doping concentration higher than that of the first N-well 204 is formed beside the diffusion area 208. The N+ doped area 210 provides the well contact of the diffusion resistor 116. A poly layer 212 deposited over the second N-well 206 provides the current terminals of the poly resistor 118 at its lateral ends. An N-type doped area 214 having a doping concentration higher than that of the second N-well 206 is formed in an edge portion of the second N-well 206. The N+ doped area 214 provides the well contact of the poly resistor 118.

As shown in FIG. 2, there is formed a first junction diode D1 at the interface of the P+ type diffusion area 208 and the first N-well 204, and a second junction diode D2 at the interface of the P-type substrate 202 and the first N-well 204. For the first junction diode D1, an equivalent anode lies in the P+ type diffusion area 208, and an equivalent cathode lies in the first N-well 204. For the second junction diode D2, an equivalent anode lies in the P-type substrate 202, and an equivalent cathode lies in the first N-well 204. However, in operation, due to the well contact of the diffusion resistor 116, i.e. the N+ doped area 210, being coupled to the supply voltage $V_{DD}$, the equivalent cathodes of the first and second junction diodes D1 and D2 are put at high voltage levels, resulting in the first and second junction diodes D1 and D2 being reverse-biased. As is known, such reverse-biased diodes have significantly high reverse leakage currents $I_{leak1}$ and $I_{leak2}$, in particular under high temperature conditions. Because the diffusion area 208, acting as the diffusion resistor 116, is coupled in the second current path 104, the reverse leakage current $I_{leak1}$ of the first junction diode D1, i.e. the current flowing into the diffusion area 208, flows into the second current path 104, and modifies the current flowing through the current channel of the fourth transistor 112. The bias current of the bias current generator circuit 100 mirroring the current of the fourth transistor 112 thereby deviates from its desired value, and deteriorates the accuracy of the bias current generator circuit 100, especially in ultra-low power applications.

FIG. 3 shows another connection of the diffusion resistor 116 in a cross-sectional view. In FIG. 3, the N+ doped area 210 is connected in the second current path 104 to an upper terminal of the diffusion resistor 116. The well contact of the diffusion resistor 116 is accordingly not connected to the supply voltage $V_{DD}$, and the reverse leakage currents of both the first and the second junction diodes D1 and D2 can be reduced. However, the N+ doped area 210 is connected with the terminal of the P+ type diffusion area 208 to the laterally left end, and the well contact of the diffusion resistor 116 is connected to the second current path 104. As a result, the reverse leakage currents of both the first and the second junction diodes D1 and D2 flowing through the well contact of the diffusion resistor 116 affect in the second current path 104, deviating the current of the current channel of the fourth transistor 112, and further the bias current generated by the bias current generator circuit 100. It is still requirable to separate the reverse leakage current from the second current path 104.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, a bias current generator circuit includes a first current path between a supply voltage terminal and a ground level, a second current path between the supply voltage terminal and the ground level, and a leakage control circuit. The first current path includes a series connection of the respective main terminals of a first transistor, a second transistor, and a third transistor. The second current path includes a series connection of the respective main terminals of a fourth transistor and a fifth transistor, and a diffusion resistor. The diffusion resistor has an upper terminal connected to the fifth transistor, a lower terminal connected in the second current path, and a well contact. Note that as used herein, the terms "upper terminal" and "lower terminal" refer to voltage levels, rather than to physical position. The diffusion resistor has a reverse leakage current in response to a voltage at the well contact higher than that at the upper terminal. The leakage control circuit includes series connected a sixth transistor and a seventh transistor. The sixth transistor is connected to the supply voltage, and the seventh transistor has a source terminal connected to the well contact of the diffusion resistor to apply a driving voltage to the well contact of the diffusion resistor of the second current path; and to allow the reverse leakage current of the diffusion resistor to flow into the leakage control circuit by way of the well contact of the diffusion resistor.

In another embodiment, a bias current generator circuit includes a current path and a leakage control circuit. The current path is connected between a supply voltage and a ground level. The current path includes a transistor and a resistor. The transistor has a current channel connected in the current path. The resistor has an upper terminal and a lower terminal connected in the current path, and a well contact arranged to allow a reverse leakage current of the resistor to flow through. The leakage control circuit is connected to the supply voltage. The leakage control circuit includes a driving transistor arranged to provide a driving voltage to the well contact of the resistor, and to allow the reverse leakage current of the resistor to flow into the leakage control circuit.

BRIEF DESCRIPTION OF THE DRAWINGS

So that the manner in which the above recited features of the present disclosure can be understood in detail, a more detailed description of the disclosure may be had by reference to embodiments, some of which are illustrated in the appended drawings. The appended drawings illustrate only typical embodiments of the disclosure and should not limit the scope of the disclosure, as the disclosure may have other equally effective embodiments. The drawings are for facilitating an understanding of the disclosure and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 1:
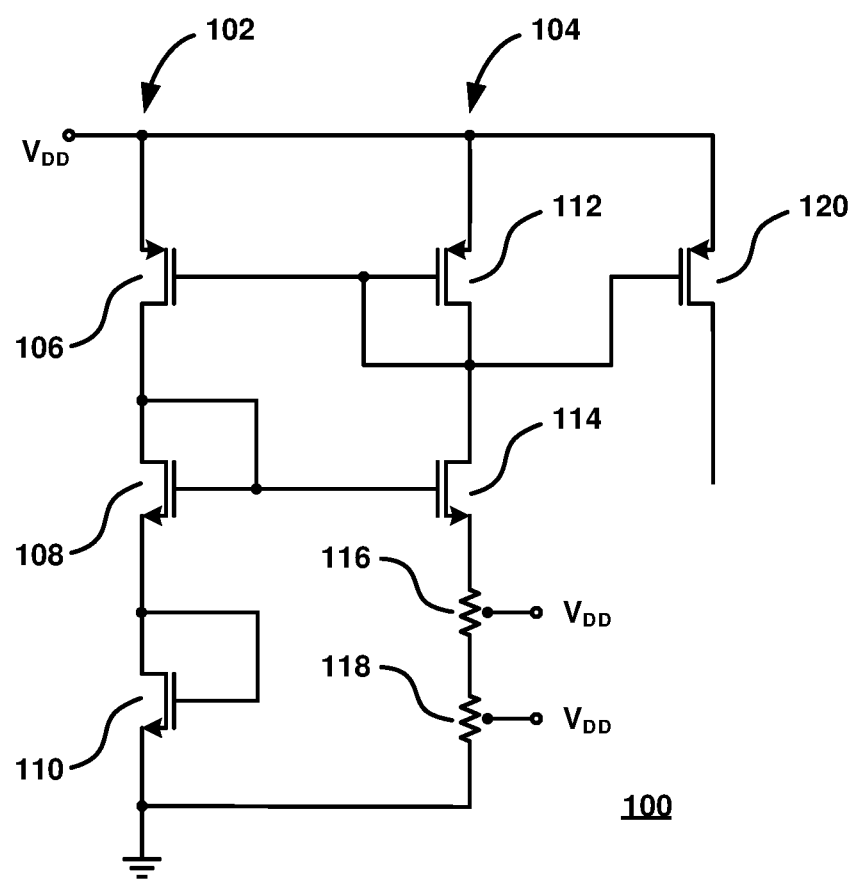
FIG. 1 is a circuit diagram of a bias current generator circuit.
Figure 4:
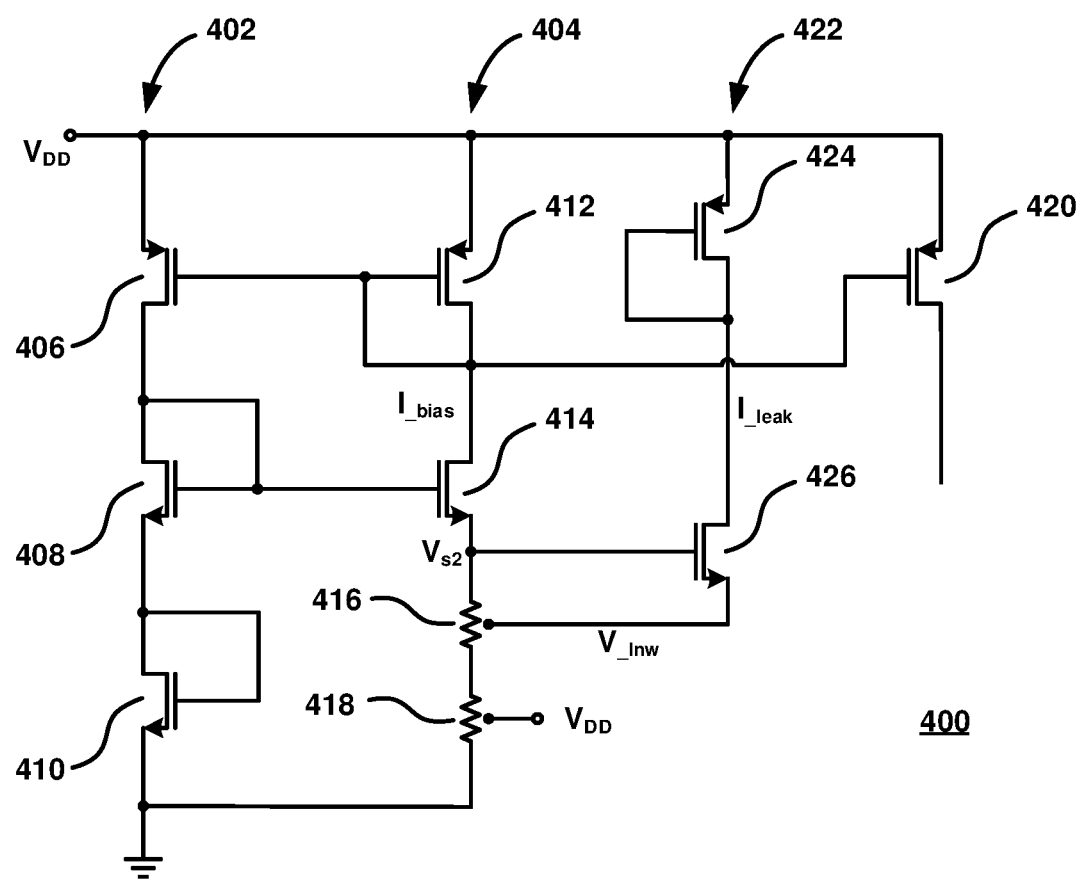
FIG. 4 is a circuit diagram of a bias current generator circuit according to an embodiment.

FIG. 4 shows a circuit diagram of a bias current generator circuit according to an embodiment. Similar to the bias current generator circuit of FIG. 1, the bias current generator circuit 400 of the embodiment in FIG. 4 includes a first current path 402 and a second current path 404. The first current path 402 and the second current path 404 are connected in parallel between the supply voltage $V_{DD}$ and a ground level. The first current path 402 includes series connected a first transistor 406, a second transistor 408, and a third transistor 410. The second current path 404 includes series connected a fourth transistor 412, a fifth transistor 414, a diffusion resistor 416, and a poly resistor 418.

In the embodiment shown, the first transistor 406 is a PMOS transistor, the second and third transistors 408 and 410 are NMOS transistors. A source terminal of the first transistor 406 is connected to the supply voltage $V_{DD}$, and a drain terminal of the first transistor 406 is connected to a drain terminal of the second transistor 408. A source terminal of the second transistor 408 is connected to a drain terminal of the third transistor 410. A source terminal of the third transistor 410 is connected to the ground level. A gate or control terminal of the first transistor 406 connects to a gate or control terminal of the fourth transistor 412. Gate or control and drain terminals of the second transistor 408 are connected, and the gate or control terminal of the second transistor 408 is connected to a gate or control terminal of the fifth transistor 414. Gate or control and drain terminals of the third transistor 410 are connected.

In the second current path 404, the fourth transistor 412 is a PMOS transistor, and the fifth transistor 414 is an NMOS transistor. A source terminal of the fourth transistor 412 is connected to the supply voltage $V_{DD}$, and a drain terminal of the fourth transistor 412 is connected to the drain terminal of the fifth transistor 414. A source terminal of the fifth transistor 414 connects to the diffusion resistor 416. Gate or control and drain terminals of the fourth transistor 412 are connected.

The diffusion resistor 416 and the poly resistor 418 each has an upper terminal, a lower terminal, and a well contact. The upper terminal of the diffusion resistor 416 connects to the source terminal of the fifth transistor 414. The lower terminal of the diffusion resistor 416 connects to the upper terminal of the poly resistor 418. The lower terminal of the poly resistor 418 connects to the ground level. The well contact of the poly resistor 418 is connected to receive the supply voltage $V_{DD}$. In operation of the bias current generator circuit 400, a current of the second current path 404, i.e. a current of a current channel of the fourth transistor 412, is used for generating a bias current by way of a mirror transistor 420 connected to mirror the fourth transistor 412. The diffusion resistor 416 and the poly resistor 418 trim the temperature coefficient of the current of the second current path 404, and accordingly of the bias current generated by the bias current generator circuit 400.

In the embodiment of FIG. 4, the bias current generator circuit 400 further includes a leakage control circuit 422 connected between the supply voltage VDD and the well contact of the diffusion resistor 416. The leakage control circuit 422 includes a sixth transistor 424 and a seventh transistor 426 that are series connected. In this embodiment, the sixth transistor 424 is a PMOS transistor, and the seventh transistor 426 is an NMOS transistor. A source terminal of the PMOS transistor 424 is connected to the supply voltage VDD, and a drain terminal of the PMOS transistor 424 is connected to a drain terminal of the NMOS transistor 426. Gate or control and drain terminals of the PMOS transistor 424 are connected. The PMOS transistor 424 thereby connects as a diode. The diode-connected PMOS transistor 424 is connected between the supply voltage $V_{DD}$ and the NMOS transistor 426, for protecting the NMOS transistor 426 against ESD risks. The PMOS transistor 424 thereby can be referred to as a protection transistor. A source terminal of the NMOS transistor 426 connects to the well contact of the diffusion resistor 416, and a gate or control terminal of the NMOS transistor 426 is connected to the source terminal of the fifth transistor 414 and the upper terminal of the diffusion resistor 416. The source terminal of the NMOS transistor 426 provides a driving voltage to the diffusion resistor 416 to the well contact of the diffusion resistor 416, accordingly the seventh NMOS transistor 426 is also referred to as a driving transistor.

Figure 2:
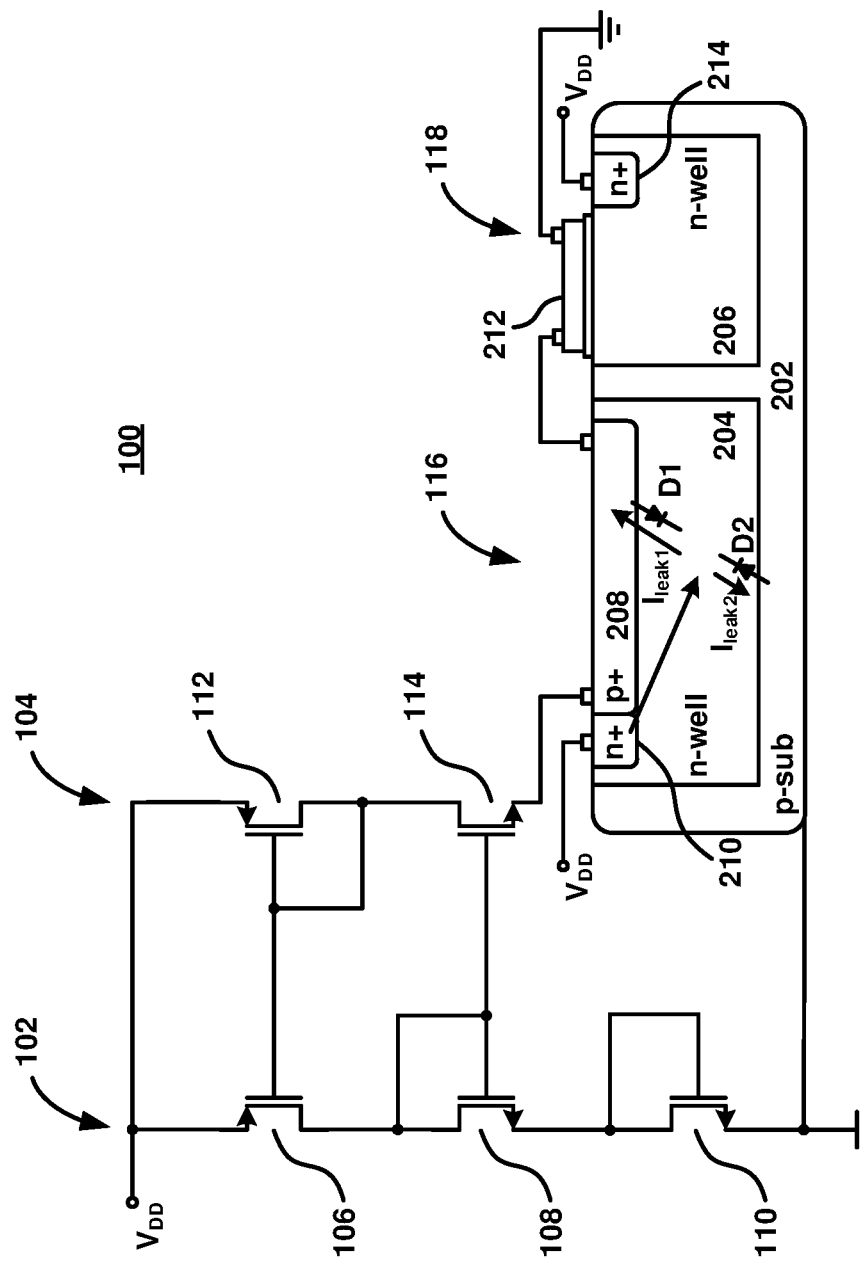
FIG. 2 is a structural diagram of the diffusion resistor and the poly resistor of FIG. 1.
Figure 3:
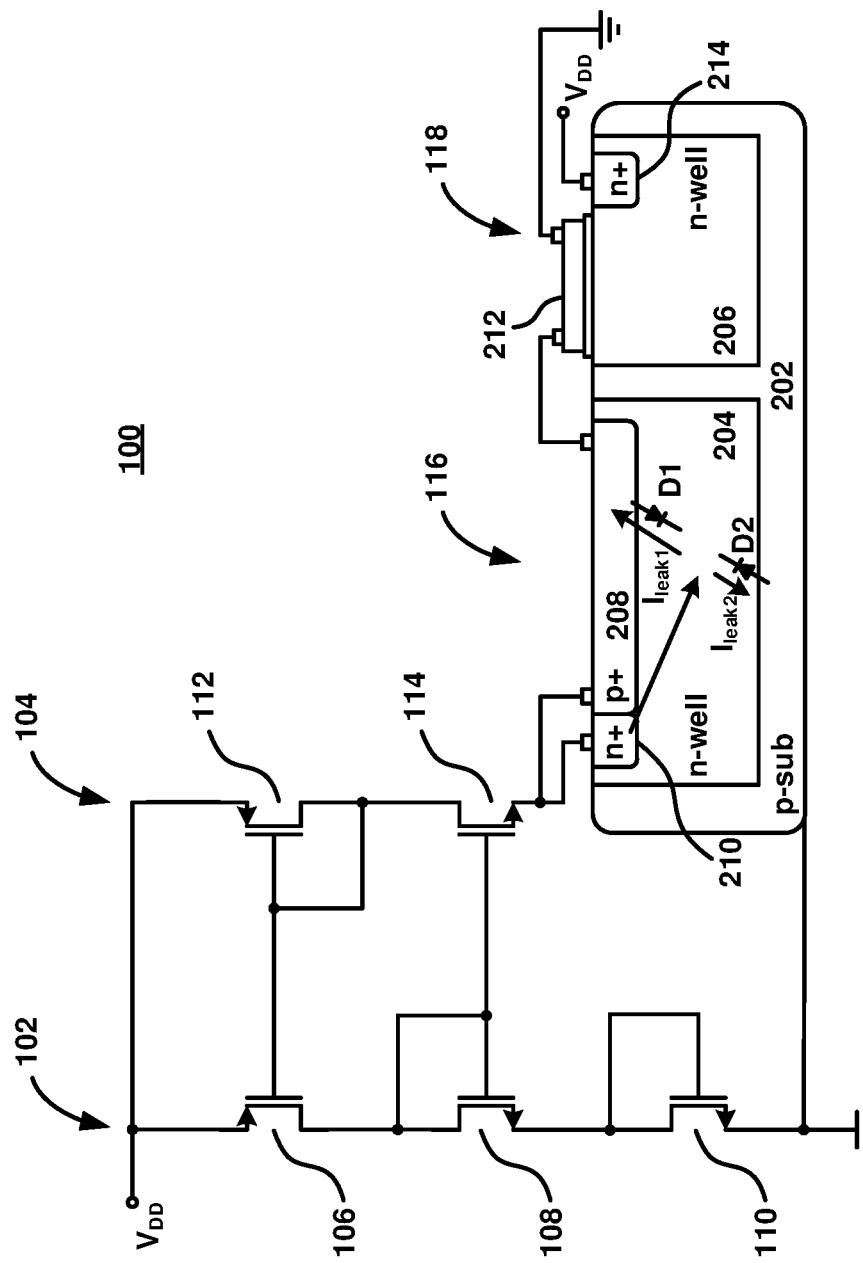
FIG. 3 is a structural diagram of the diffusion resistor and the poly resistor of FIG. 1 in another connection.
Figure 5:
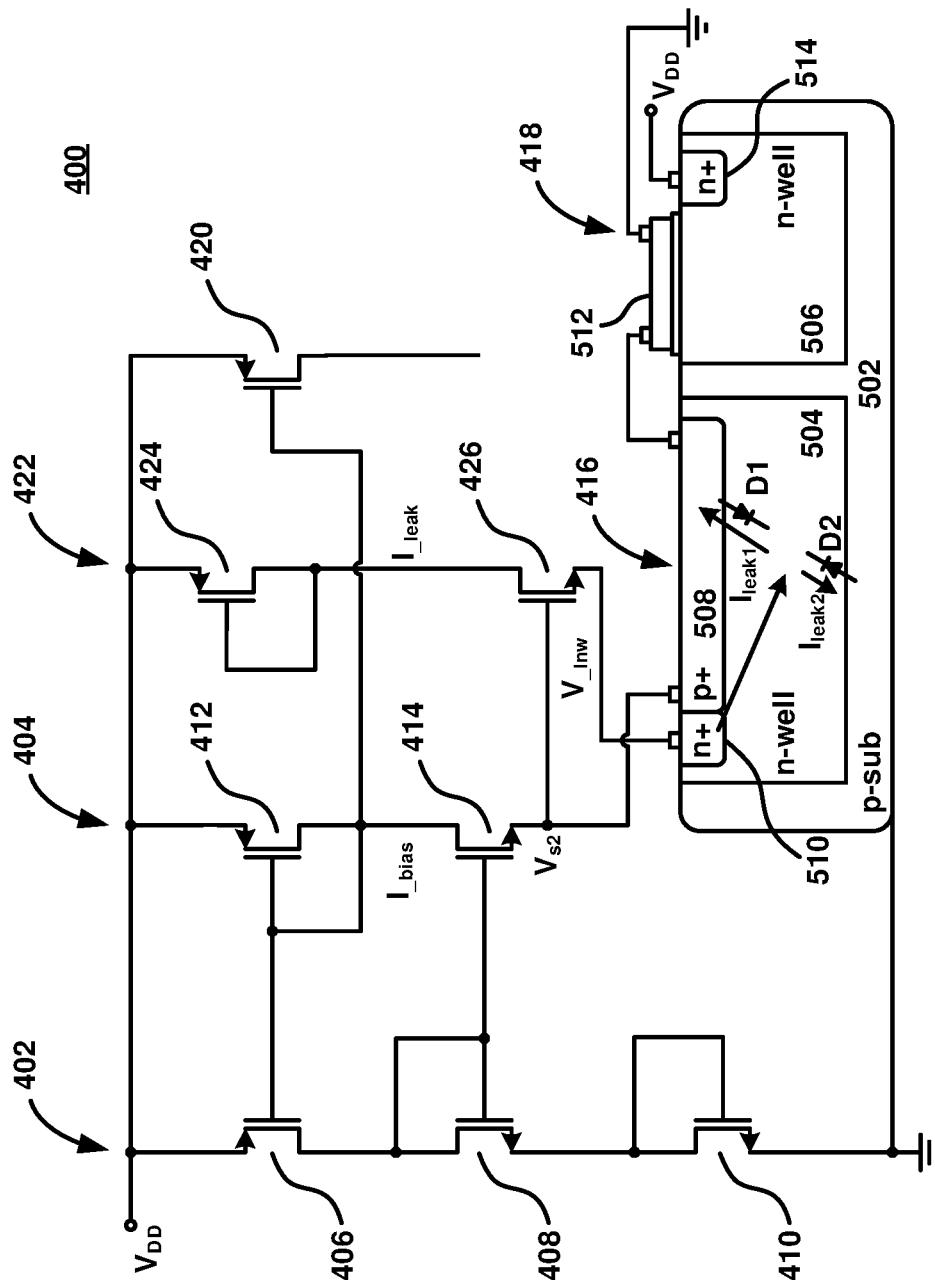
FIG. 5 is a structural diagram of the diffusion resistor and the poly resistor of FIG. 4 in a cross-sectional view.

FIG. 5 shows the structural diagram of the diffusion resistor 416 and the poly resistor 418 in a cross-sectional view. Similar to that shown in FIG. 2, the diffusion resistor 416 and the poly resistor 418 are configured on a substrate 502. The substrate 502 is a P-type doped substrate according to the present embodiment. The diffusion resistor 416 is arranged in a first N-well 504 on the P-type substrate 502, and the poly resistor 418 is arranged over a second N-well 506 on the P-type substrate 502. A diffusion area 508 is formed in the first N-well 504 to provide the diffusion resistor 416. A poly layer 512 is formed over the second N-well 506 to provide the poly resistor 418. In the present embodiment, the diffusion area 508 and the poly layer 512 are both P+ doped but without silicide, accordingly the diffusion resistor 416 and the poly resistor 418 have relatively high square resistances (a typically square resistance of the diffusion resistor 416 is around 226.6 ohm/square, and a typical square resistance of the poly resistor 418 is around 601.0 ohm/square). The P+ doped diffusion area 508 has a positive temperature coefficient (TC), while the P+ doped poly layer 512 has a negative TC.

The diffusion area 508 has a higher doping concentration than that of the P-type substrate 502, and can be referred to as a P+ type diffusion area 508. An N-type doped area 510 is arranged beside the diffusion area 508. In this embodiment, the N-type doped area 510 has a doping concentration higher than that of the first N-well 504, and can be referred to as an N+ doped area 510. The N+ doped area 510 is used for applying a relatively high voltage to the first N-well 504, so that a PN junction between the P+ type diffusion area 508 and the first N-well 504 is reversely biased, to prevent the PN junction from being forward conductive, and prevent leaking current from the P+ type diffusion area 508.

In the present embodiment, the N+ doped area 510 is connected to the source terminal of the NMOS transistor 426 of the leakage control circuit 422. The NMOS transistor 426 according to the present embodiment is a native device having a negative threshold gate-source voltage $V_{th}$ at typical processes and room temperatures. With reference to FIG. 4, in operation, the source terminal of the NMOS transistor 426, connecting to the well contact of the diffusion resistor 416, provides the driving voltage slightly higher than a voltage on its gate or control terminal which connects to the upper terminal of the diffusion resistor 416. In FIG. 5, the voltage $V_{\_Inw}$ of the N+ doped area 510 is only slightly higher, for example tens of millivolts (mV), than the voltage $V_{s2}$ of the P+ type diffusion area 508, resulting in a negligible reverse leakage current $I_{leak1}$ of a first junction diode D1 at the interface of the P+ type diffusion area 508 and the first N-well 504. Furthermore, the reverse leakage current $I_{leak1}$ mainly flows through the leakage control circuit 422, i.e. the diode-connected PMOS transistor 424 and the native NMOS transistor 426, without affecting the second current path 404. The stability and robustness of the bias current generated by the mirror transistor 420, against temperature and leakage current, is thereby improved.

Figure 6:
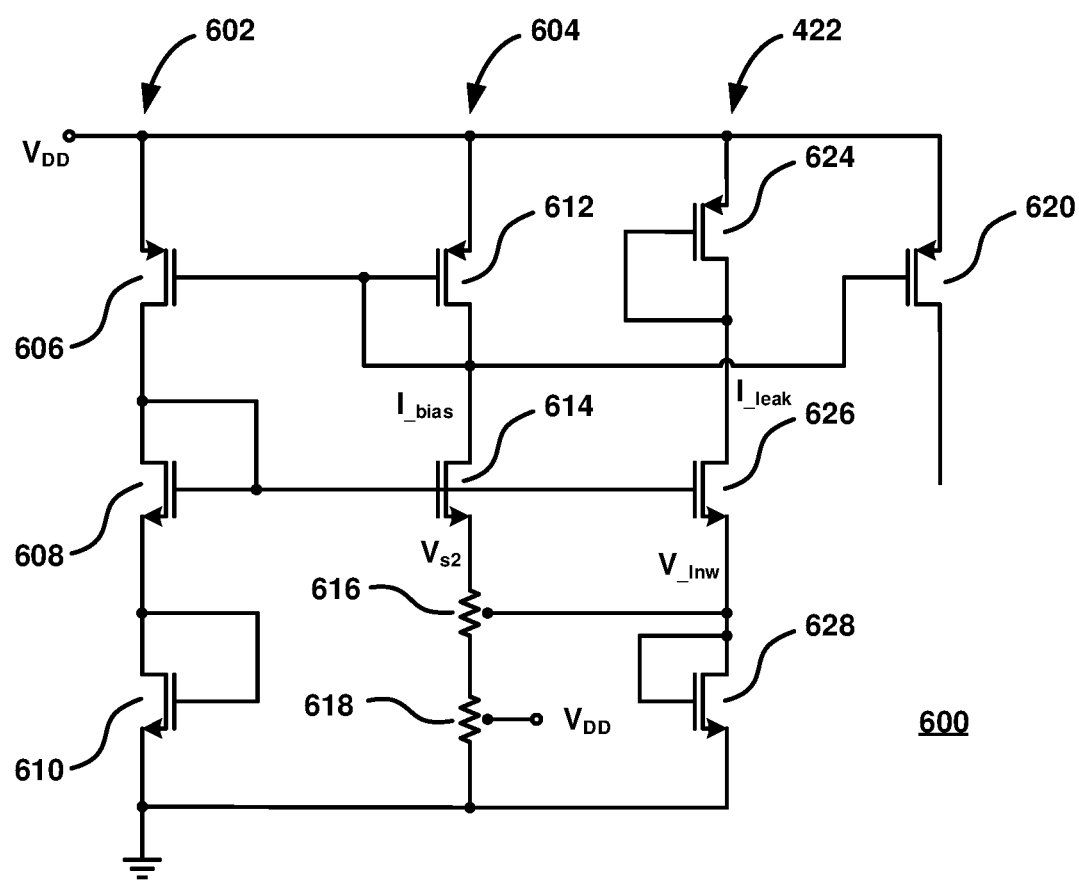
FIG. 6 is a circuit diagram of a bias current generator circuit according to another embodiment.

FIG. 6 shows a circuit diagram of a bias current generator circuit 600 according to another embodiment. The bias current generator circuit 600 is similar to the bias current generator circuit 400 of FIG. 4, and includes a first current path 602 and a second current path 604. However, in this embodiment, the voltage difference between the upper terminal and the well contact of the diffusion resistor 616 is driven by a different leakage control circuit 622. The first current path 602 include a first PMOS transistor 606, a second NMOS transistor 608, and a third NMOS transistor 610 that are series connected between the supply voltage $V_{DD}$ and the ground level. The second current path 604 includes a fourth PMOS transistor 612, a fifth NMOS transistor 614, a diffusion resistor 616, and a poly resistor 618 that are series connected between the supply voltage $V_{DD}$ and the ground level. The bias current generator circuit 600 includes a mirror PMOS transistor 620 connected as a mirror to the fourth PMOS transistor 612, to generate a mirror current as the bias current provided by the bias current generator circuit 600.

The bias current generator circuit 600 includes the leakage control circuit 622 connected between the supply voltage $V_{DD}$ and the ground level. The leakage control circuit 622 includes a sixth transistor 624, a seventh transistor 626, and an eighth transistor 628 that are series connected. In the present embodiment, the sixth transistor 624 is a PMOS transistor connected as a diode to protect the seventh transistor 626 against ESD risks, and the eighth transistor 628 is an NMOS transistor connected as a diode to provide a load to the seventh transistor 626 and stabilize an output voltage of the seventh transistor 626. The sixth transistor 624 thereby can be referred to as a protection transistor, and the eighth transistor 628 can be referred to as a load transistor. The seventh transistor 626 is an NMOS transistor, having a drain terminal connected to the sixth PMOS transistor 624, a gate or control terminal connected to the gate or control terminal of the second and fifth transistors 608 and 614, and a source terminal connected to the eighth NMOS transistor 628. The source terminal of the seventh NMOS transistor 626 is connected to the well contact of the diffusion resistor 616, to apply its output voltage to the diffusion resistor 616.

The source terminal of the NMOS transistor 626 provides a driving voltage to the diffusion resistor 616 by applying the driving voltage to the well contact of the diffusion resistor 616, accordingly the seventh NMOS transistor 626 is also referred to as a driving transistor.

Figure 7:
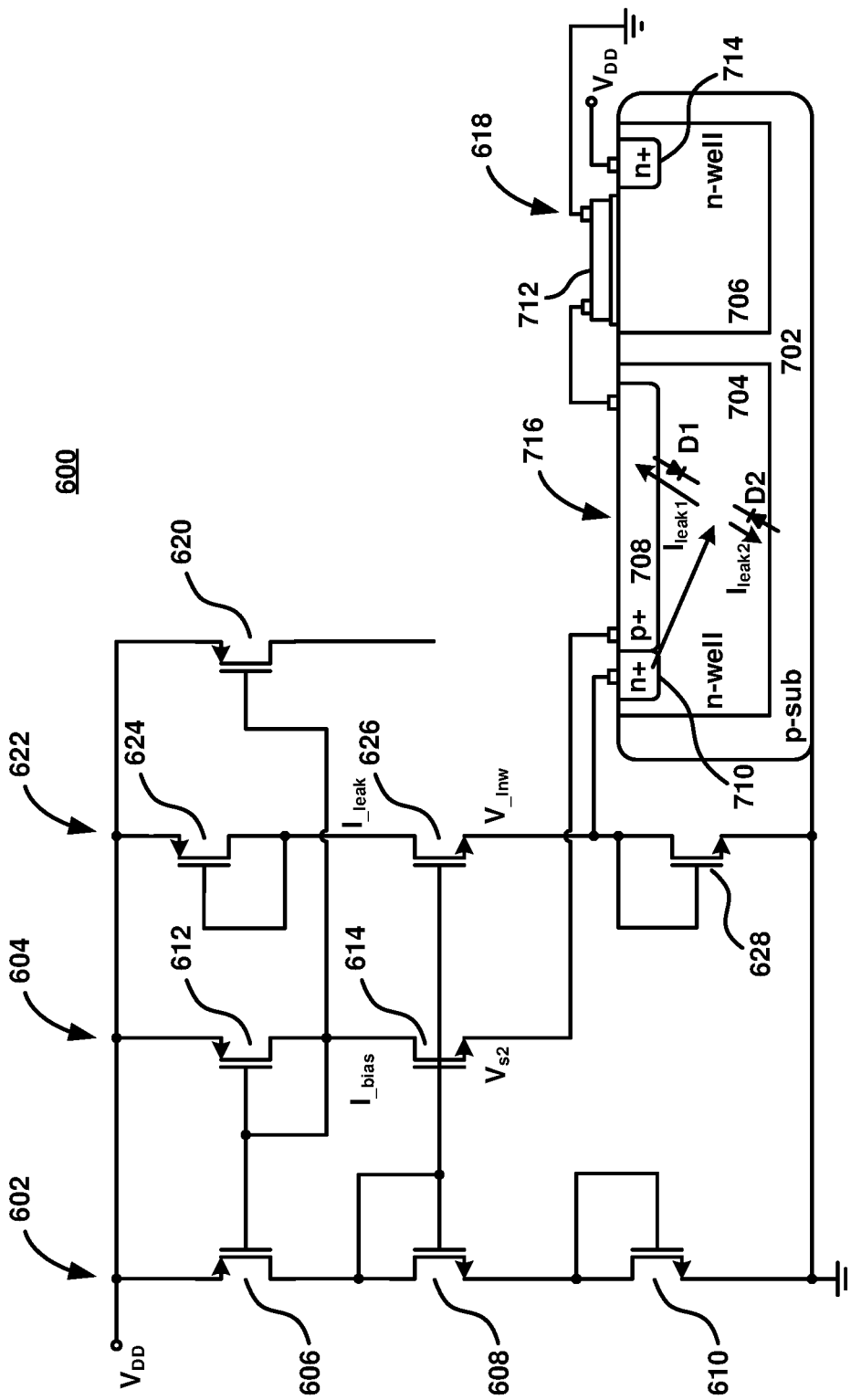
FIG. 7 is a structural diagram of the diffusion resistor and the poly resistor of FIG. 6 in a cross-sectional view.

FIG. 7 is a structural diagram of the diffusion resistor and the poly resistor of FIG. 6 in a cross-sectional view. The diffusion resistor 616 and the poly resistor 618 are both arranged on a P-type substrate 702, respectively in a first N-well 704 and over a second N-well 706. Both resistors have similar configurations to the resistors of FIG. 5, and is not described in details here. The N+ doped area 710 is connected to the source terminal of the seventh NMOS transistor 626. The laterally left end of the diffusion area 708, which is the upper terminal of the diffusion resistor 616, is connected to the source terminal of the fifth NMOS transistor 614.

With reference to FIG. 6, the source terminal of the seventh NMOS transistor 626 applies a driving voltage $V_{\_lnw}$ to the well contact of the diffusion resistor 616. Because gate or control terminals of the fifth NMOS transistor 614 and the seventh NMOS transistor 626 are connected, voltages on the source terminals of the fifth and seventh NMOS transistors 614 and 626 depend on the gate-source voltage drops of the fifth and seventh transistors 614 and 626. The higher the gate-source voltage drop is, the lower the source terminal voltage is. As the gate-source voltage drop of a transistor has positive correlation with the current flowing through the transistor, the voltage $V_{\_lnw}$ on the well contact of the diffusion resistor 616 is slightly higher than the voltage $V_{s2}$ on the upper terminal of the diffusion resistor 616, because the current $I_{\_leak}$ of the leakage control circuit 622 including mainly the reverse leakage current $I_{\_leak1}$ of the first junction diode D1 and the current of the eighth transistor 628 is lower than the current $I_{\_bias}$ of the second current path 604. In an example, at a temperature of 140° C., the current $I_{\_bias}$ of the second current path 604 is 1.36 times the current $I_{\_leak}$ of the leakage control circuit 622, and the source terminal voltage $V_{\_lnw}$ of the seventh NMOS transistor 626, provided as the driving voltage to the well contact of the diffusion resistor 616, is 16.4 mV higher than the source terminal voltage $V_{s2}$ of the fifth transistor 614.

In the embodiment of FIG. 7, the reverse leakage current of the first junction diode D1 flows through the N+ doped area 710 connecting in the leakage control circuit 622, almost not affecting the second current path 604. As described above, the voltage on the well contact of the diffusion resistor 616 is only tens of millivolts higher than the voltage on its upper terminal, in the first junction diode D1 the reverse-biased voltage is low enough to cause negligible reverse leakage current, further minimizing the deviation of the bias current from its desired value.

The embodiment of the bias current generator circuit includes the second current path which includes the fourth transistor. The current of the fourth transistor is used by the current mirror transistor to generate the bias current. The second current path further includes the diffusion resistor and the poly resistor that are series connected with the fourth transistor. The diffusion resistor has an upper terminal connected to the fourth transistor by way of the fifth transistor, a lower terminal connected to the poly resistor, and a well contact. The bias current generator circuit further includes a leakage control circuit which provides a control voltage to the well contact of the diffusion resistor. A reverse leakage current of the diffusion resistor flows through the leakage control circuit. The control voltage is higher than the voltage on the upper terminal of the diffusion resistor. In alternative embodiments, the poly resistor and the diffusion resistor can be interchanged, by connecting the poly resistor between the diffusion resistor and the fifth transistor.

The use of the terms "a" and "an" and "the" and similar referents in the context of describing the subject matter (particularly in the context of the following claims) are to be construed to cover both the singular and the plural, unless otherwise indicated herein or clearly contradicted by context. The terms "coupled" and "connected" both mean that there is an electrical connection between the elements being coupled or connected, and neither implies that there are no intervening elements. In describing transistors and connections thereto, the terms gate, drain and source are used interchangeably with the terms "gate terminal", "drain terminal" and "source terminal". Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the disclosure as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A bias current generator circuit comprising:
   a first current path between a supply voltage terminal and a ground level and comprising a series connection of the respective main terminals of a first transistor, a second transistor, and a third transistor;
   a second current path between the supply voltage terminal and the ground level and comprising a series connection of the respective main terminals of a fourth transistor and a fifth transistor, and a diffusion resistor;
   wherein the diffusion resistor has an upper terminal connected to the fifth transistor, a lower terminal connected in the second current path, and a well contact;
   the diffusion resistor has a reverse leakage current in response to a voltage at the well contact higher than that at the upper terminal;

a leakage control circuit comprising series connected a sixth transistor and a seventh transistor; wherein the sixth transistor is connected to the supply voltage, and the seventh transistor has a source terminal connected to the well contact of the diffusion resistor to:

apply a driving voltage to the well contact of the diffusion resistor of the second current path; and allow the reverse leakage current of the diffusion resistor to flow into the leakage control circuit by way of the well contact of the diffusion resistor.

2. The bias current generator circuit of claim 1, wherein the diffusion resistor is arranged in an N-well on a P-type substrate, and comprises:

a P-type diffusion area in the N-well to provide the upper terminal and the lower terminal of the diffusion resistor; and a N+ doped area beside the diffusion area to provide the well contact to receive the driving voltage;

wherein the reverse leakage current of the diffusion resistor flows through a PN junction at an interface of the P-type diffusion area and the N-well.

3. The bias current generator circuit of claim 1, wherein the sixth transistor of the leakage control circuit is a diode-connected PMOS transistor having a source terminal connected to the supply voltage, a drain terminal connected to the seventh transistor, and a gate terminal connected to the drain terminal of the sixth transistor.

4. The bias current generator circuit of claim 1, wherein the seventh transistor of the leakage control circuit is an NMOS transistor having a drain terminal connected to the sixth transistor, and a gate terminal connected to the upper terminal of the diffusion resistor of the second current path.

5. The bias current generator circuit of claim 4, wherein the seventh transistor is a native NMOS transistor having a negative gate-source voltage to cause the driving voltage provided at the source terminal of the seventh transistor higher than a voltage at the upper terminal of the diffusion resistor.

6. The bias current generator circuit of claim 1, wherein the fifth transistor of the second current path is an NMOS transistor having a drain terminal connected to the fourth transistor, and a source terminal connected to the upper terminal of the diffusion resistor;

the seventh transistor of the leakage control circuit is an NMOS transistor having a drain terminal connected to the sixth transistor, and a gate terminal connected to the gate terminal of the fifth transistor.

7. The bias current generator circuit of claim 6, wherein a gate-source voltage drop of the seventh transistor is lower than that of the fifth transistor, to cause the driving voltage provided at the source terminal of the seventh transistor higher than a voltage at the upper terminal of the diffusion resistor.

8. The bias current generator circuit of claim 6, wherein the leakage control circuit further comprises an eighth transistor connected between the source terminal of the seventh transistor and the ground level; the eighth transistor is diode-connected to provide a load to the seventh transistor.

9. The bias current generator circuit of claim 1, further comprising a mirror transistor connected as a mirror to the fourth transistor, to generate a mirror current to a current of the fourth transistor as a bias current to be provided as an output of the bias current generator circuit.

10. A bias current generator circuit comprising:

a current path connected between a supply voltage and a ground level; wherein the current path comprises a transistor and a resistor; the transistor has a current channel connected in the current path; the resistor has an upper terminal and a lower terminal connected in the current path, and a well contact configured to allow a reverse leakage current of the resistor to flow through; and a leakage control circuit connected to the supply voltage; wherein the leakage control circuit comprises a driving transistor configured to provide a driving voltage to the well contact of the resistor, and to allow the reverse leakage current of the resistor to flow into the leakage control circuit, wherein the driving transistor is a native NMOS transistor having a gate terminal connected to the upper terminal of the resistor of the current path, a drain terminal connected to the supply voltage, and a source terminal connected to the well contact of the resistor.

11. The bias current generator circuit of claim 10, wherein the resistor of the current path is a diffusion resistor which comprises:

a diffusion area providing the upper terminal and the lower terminal of the resistor at lateral ends; and a doped area beside the diffusion area providing the well contact of the resistor.

12. The bias current generator circuit of claim 11, wherein the diffusion area and the doped area are arranged in a well, the diffusion area and the well have opposite dopant types to cause the reverse leakage current in the diffusion resistor at an interface of the well and the diffusion area in response to the well being applied the driving voltage higher than a voltage of the diffusion area.

13. The bias current generator circuit of claim 10, wherein the native NMOS transistor has a negative gate-source voltage drop to cause the driving voltage at the well contact of the resistor higher than a voltage at the upper terminal of the resistor.

14. The bias current generator circuit of claim 10, wherein a current of the current channel of the transistor is mirrored by a mirror transistor to generate a mirror current to be provided as a bias current from the bias current generator circuit.

15. The bias current generator circuit of claim 14, wherein the transistor is a PMOS transistor having a source terminal connected to the supply voltage, a drain terminal connected in the current path, and a gate terminal connected to the drain terminal.

16. The bias current generator circuit of claim 10, wherein the transistor is a PMOS transistor having source and drain terminals connected in the current path;

the current path further comprises an NMOS transistor having a drain terminal connected to the drain terminal of the PMOS transistor, and a source terminal connected to the upper terminal of the resistor; and the driving transistor has a gate terminal connected to a gate terminal of the NMOS transistor of the current path, a drain terminal connected to the supply voltage, and a source terminal connected to the well contact of the resistor.

17. A bias current generator circuit comprising:

a current path connected between a supply voltage and a ground level; wherein the current path comprises a transistor and a resistor; the transistor has a current channel connected in the current path; the resistor has an upper terminal and a lower terminal connected in the current path, and a well contact configured to allow a reverse leakage current of the resistor to flow through; and a leakage control circuit connected to the supply voltage;
wherein the leakage control circuit comprises a driving transistor configured to provide a driving voltage to the well contact of the resistor, and to allow the reverse leakage current of the resistor to flow into the leakage control circuit, wherein:

the transistor is a PMOS transistor having source and drain terminals connected in the current path;

the current path further comprises an NMOS transistor having a drain terminal connected to the drain terminal of the PMOS transistor, and a source terminal connected to the upper terminal of the resistor; and the driving transistor has a gate terminal connected to a gate terminal of the NMOS transistor of the current path, a drain terminal connected to the supply voltage, and a source terminal connected to the well contact of the resistor.

18. The bias current generator circuit of claim 17, wherein the driving transistor is an NMOS transistor having a gate-source voltage drop lower than that of the NMOS transistor of the current path, to cause the driving voltage at the source terminal of the driving transistor higher than the voltage at the source terminal of the NMOS transistor of the current path.

19. A bias current generator circuit comprising:

a current path connected between a supply voltage and a ground level; wherein the current path comprises a transistor and a resistor; the transistor has a current channel connected in the current path; the resistor has an upper terminal and a lower terminal connected in the current path, and a well contact configured to allow a reverse leakage current of the resistor to flow through; and a leakage control circuit connected to the supply voltage; wherein the leakage control circuit comprises a driving transistor configured to provide a driving voltage to the well contact of the resistor, and to allow the reverse leakage current of the resistor to flow into the leakage control circuit, wherein the leakage control circuit further comprises:

a diode-connected transistor connected between the supply voltage and the driving transistor, and a diode-connected transistor connected between the driving transistor and the ground level.

\* \* \* \* \*